(12) United States Patent
Leung et al.

(10) Patent No.: US 7,567,123 B2
(45) Date of Patent: Jul. 28, 2009

(54) ADAPTIVE BIAS CURRENT CIRCUIT AND METHOD FOR AMPLIFIERS

(75) Inventors: Vincent W. Leung, Plainsboro, NJ (US);
Prasad S. Gudem, San Diego, CA (US);
Lawrence E. Larsen, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 183 days.

(21) Appl. No.: 10/587,414

(22) PCT Filed: Feb. 14, 2005

(86) PCT No.: PCT/US2005/004429

§ 371 (c)(1),
(2), (4) Date: Nov. 7, 2006

(87) PCT Pub. No.: WO2005/079313

PCT Pub. Date: Sep. 1, 2005

(65) Prior Publication Data

US 2007/0252646 A1    Nov. 1, 2007

Related U.S. Application Data

(60) Provisional application No. 60/544,719, filed on Feb. 13, 2004.

(51) Int. Cl.
*H03G 3/20* (2006.01)
(52) U.S. Cl. .................. 330/136; 330/261; 330/296
(58) Field of Classification Search ................ 330/136, 330/257, 261, 285, 296, 252, 253, 288, 300
See application file for complete search history.

(56) References Cited

U.S. PATENT DOCUMENTS

| 6,114,912 A | 9/2000 | Ashby et al. |
| 6,429,743 B2 * | 8/2002 | Iga .............................. 330/257 |
| 6,496,067 B1 * | 12/2002 | Behzad et al. .............. 330/261 |
| 2003/0076171 A1 | 4/2003 | Hwang |

FOREIGN PATENT DOCUMENTS

WO    WO 00/19327    4/2000

(Continued)

OTHER PUBLICATIONS

E.Taniguchi, T. Ikushima, K. Itoh, N. Suematsu, "A Dual Bias-Feed Circuit Design for SiGe HTB Low-Noise Linear Amplifier," IEEE Trans. Microwave Theory Tech., vol. 51, No. 2, Feb. 2003, pp. 414-421.

(Continued)

*Primary Examiner*—Khanh V Nguyen
(74) *Attorney, Agent, or Firm*—Greer, Burns & Crain, Ltd.

(57) ABSTRACT

An adaptive bias method and circuits for amplifiers that provide a substantial current boost based at least partly upon a sensed input power of an amplifier circuit. Methods and circuits of the invention provide an additional bias current based upon the sensed input power. Circuits of the invention may be simple, area-efficient, low-power, stable and digitally-programmable. In addition, methods and circuits of the invention may be used with a number of amplifier circuit configurations, including amplifiers having either inductor and/or resistive degeneration.

22 Claims, 4 Drawing Sheets

FOREIGN PATENT DOCUMENTS

| WO | WO 00/45507 | 8/2000 |
| WO | WO 03/005574 | 1/2003 |
| WO | WO 2004/070970 | 8/2004 |

OTHER PUBLICATIONS

Vincent Leung et al., "Digital-IF WCDMA Handset Transmitter IC in 0.25 μm SiGe BiCMOS", Solid-State Circuits Conference 2004, Digest of Technical Papers, ISSCC, 2004, IEEE International, San Francisco, CA Feb. 15-19, 2004, Piscataway, NJ, IEEE, Feb. 15, 2004, pp. 182-191.

Shintaro Shinjo et al., "Low Quiescent Current SiGE HBT Driver Amplifier Having Self Base Bias Control Circuit", IEICE Transactions on Electronics, vol. E85-C, No. 7, pp. 1404-1411., Jul. 1, 2002, Abstract only.

Tirdad Sowlati et al., "Bias Boosting Technique for a 1.9GHz Class AB RF Amplifier", Low Power Electronics and Design, 2000, Proceedings of the 2000 International Symposium on Jul. 26-27, 2000, Piscataway, NJ.

* cited by examiner

ADAPTIVE BIAS CURRENT CIRCUIT AND METHOD FOR AMPLIFIERS

PRIORITY CLAIM

Applicants claim priority benefits under 35 U.S.C. § 119 on the basis of Patent Application No. 60/544,719, filed Feb. 13, 2004.

TECHNICAL FIELD

A general field of the invention is amplifiers. A particular field of the invention is radio frequency (RF) amplifiers, e.g., amplifiers utilized in handsets and other devices that receive and transmit RF signals and typically use portable power supplies.

BACKGROUND ART

Efficient amplifiers are important for RF applications. A typical RF device uses a portable power source, e.g., a battery. The operation of the RF device is enhanced when the demand on the battery is reduced. The RF circuits of a portable device, however, present one of biggest demands on the power source of a portable device. In particular, the amplifiers in RF circuits consume considerable power.

There are different methods of RF signal transmission. In some methods, the information to be transmitted is completely coded in the phase of the RF signals that are transmitted. GSM is an exemplary standard in which the information to be transmitted is completely coded in the phase of the RF signals. In other methods, at least some information is coded in the amplitude of the RF signals. In the latter case, it is important to attempt to advance conflicting goals in the design of the RF amplifier circuit. A first goal is high average efficiency, which makes better use of the available power from a power source. A second goal is high linearity, so that the amplifier does not distort the information carrying amplitude signal. There are a number of techniques and standards that use the RF amplitude for some or all of the information carried by the RF signals.

Modern wireless data transmission methods are intended to provide for high data rates, as the traffic carried on the RF signals includes voice and bit heavy data traffic, ranging from text messaging to image data, video data, and internet protocol data. The third generation (3G) wireless communication methods utilize spectrally efficient variable-envelope modulation schemes. One such scheme is the hybrid phase-shift keying (HPSK) scheme, which has been adopted for the wideband code division multiple access (WCDMA) standard. In WDCMA spectral re-growth due to the transmitter circuit distortion is strictly limited. This often translates to stringent and challenging linearity requirements for the radio frequency (RF) amplifiers, which constitute the end of the transmitter chain and are tasked to handle the highest signal levels.

Another important, although conflicting, design criteria is the amplifier power consumption. Since RF amplifiers consume a significant share of battery power in a portable device, their power efficiencies have a direct and determining impact on the time period of device operations before a recharge or replacement of the power source, e.g., a battery, is required. Efficiency should be maximized at the amplifier's peak power level without compromising the amplifier linearity. Additionally, however, efficiency should also be high during power back-off. Achieving efficiency during both conditions has proved difficult in practice. The WCDMA standard, for example, requires power control (attenuation) to be continuously and adaptively enforced to achieve equalization of signals received by a base station irrespective of the distance from the base stations of handsets within the coverage zone of the base station. Thus, an RF amplifier should exhibit high average efficiency to prolong battery life. The amplifier's bias should be adaptive. For small signal conditions, the quiescent current should be kept to its minimum to enhance the efficiency. For large signal conditions, the current should automatically rise such that high linearity is achieved.

Class AB (or B) bias is traditionally employed in RF amplifiers to provide an adaptive bias current. There are various types of amplifiers that achieve adaptive bias current. One type of amplifier is commonly referred to as inductor base bias feed amplifier. In this circuit, an inductor is coupled between the base of an output transistor and the output of a current bias circuit. A variation is the self base bias control circuit, which adds a current mirror for feedback in the current bias circuit to increase the current multiplication effect. The current mirror feedback variation (self base bias control) of the inductor base bias feed amplifier is discussed in Shinjo, et al, "Low Quiescent Current SiGe HBT Driver Amplifier Having Self Base Bias Control Circuit," IEICE Trans. Electron., vol. E85-C, no. 7, pp. 1404-1411, July 2002.

Recognized problems with these and other amplifier circuits using inductors include the amount of real estate occupied by the inductors. Resistors, typically a small amount of polysilicon, take up far less space than inductors. A resistor base bias feed circuit omits inductors, but the backward impedance requirement of the circuit requires high value resistors. However, as the base current of the output transistor increases, so does the voltage drop across the resistor connected to the base of the output transistor. Any increase in the base current of the common-emitter amplifier thus causes a voltage drop at the base. The subsequent base-emitter voltage ($V_{be}$) reduction at large signal conditions greatly limits the current boost. The higher the resistor value (good for the impedance requirement), the more the bias circuit resembles a constant-current bias (where the collector current could not rise as power input ($P_{in}$) increases).

A variation of the resistor base bias feed adds an additional current bias circuit to feed current into the base of the output transistor. The dual bias circuit with resistor base bias is discussed in Taniguchi et al. "A Dual Bias-Feed Circuit Design for SiGe HBT Low-Noise Linear amplifier," IEEE Trans. Microwave Theory Tech., vol. 51, no. 2, pp. 414-421, February 2003.

To achieve linearity, resistor degeneration is used, but at the expense of amplifier gain. A resistor is connected to the emitter of the output transistor. In this circuit configuration, the emitter resistor raises the voltage at the emitter of the output transistor, thereby reducing the base-emitter voltage drop ($V_{BE}$), and, accordingly, the current boost effects of the above-mentioned bias schemes. Inductor degeneration avoids raising the emitter voltage, but, as mentioned above, inductors present fabrication problems due to the amount of real estate required to accommodate inductors.

SUMMARY OF THE INVENTION

The invention provides an adaptive bias method and circuits for amplifiers that provide a substantial current boost at least partly based upon a sensed input power of an amplifier circuit. Methods and circuits of the invention provide an additional bias current based upon the sensed input power. Circuits of the invention may be simple, area-efficient, low-power, stable and digitally-programmable. In addition, methods and circuits of the invention may be used with a number of amplifier circuit configurations, including amplifiers having either inductor and/or resistive degeneration.

BEST MODE OF CARRYING OUT THE INVENTION

Embodiments of the invention provide an input power based current boost to the bias circuit of an RF amplifier. In preferred embodiments of the invention, a differential transistor pair senses the input power difference of the positive and negative input voltages of an RF amplifier. As input power to the differential RF amplifier increases, the output current of the differential transistor pair clips, providing for high average current responsive to the level of input power. The differential transistors are biased with low quiescent current, so that their collector currents will be clipped during large-signal conditions, thus raising their average (dc) collector currents above the quiescent level. A low pass filter removes harmonics, and a current boost ΔI that is proportional to the input power is produced. This current boost is provided to the bias circuit of the RF amplifier. Preferably, one or more current mirrors, including a digitally programmable current mirror are provided to multiple the current boost ΔI provided to the RF amplifier bias circuit. Extra dc current, which is proportional to the input power, is applied to the RF amplifier through the digitally-programmable bias current mirror network.

Adaptive bias circuits of the invention are applicable to different types of RF amplifiers. The bias circuits of the invention may be used to counteract the effective of resistor degeneration. A preferred embodiment RF amplifier circuit of the invention uses resistor degeneration, with a resistor connected to the emitter of the output transistor. A current boost bias circuit senses the input power, and provides a current boost to maintain an efficient, increasing adaptive bias current with rising input power. The $V_{BE}$ base-emitter voltage for amplification at the output transistor is maintained while the resistive degeneration provides for linearity.

Preferred embodiments will now be discussed with reference to the figures. From the description of the preferred embodiments, artisans will understand broader aspects of the invention. Artisans will also appreciate that the adaptive bias circuits and methods of the invention are applicable generally to RF amplifier circuits of the class AB/B variety, as the principles of the invention may be used to provide both high average efficiency and high linearity.

Figure 1:
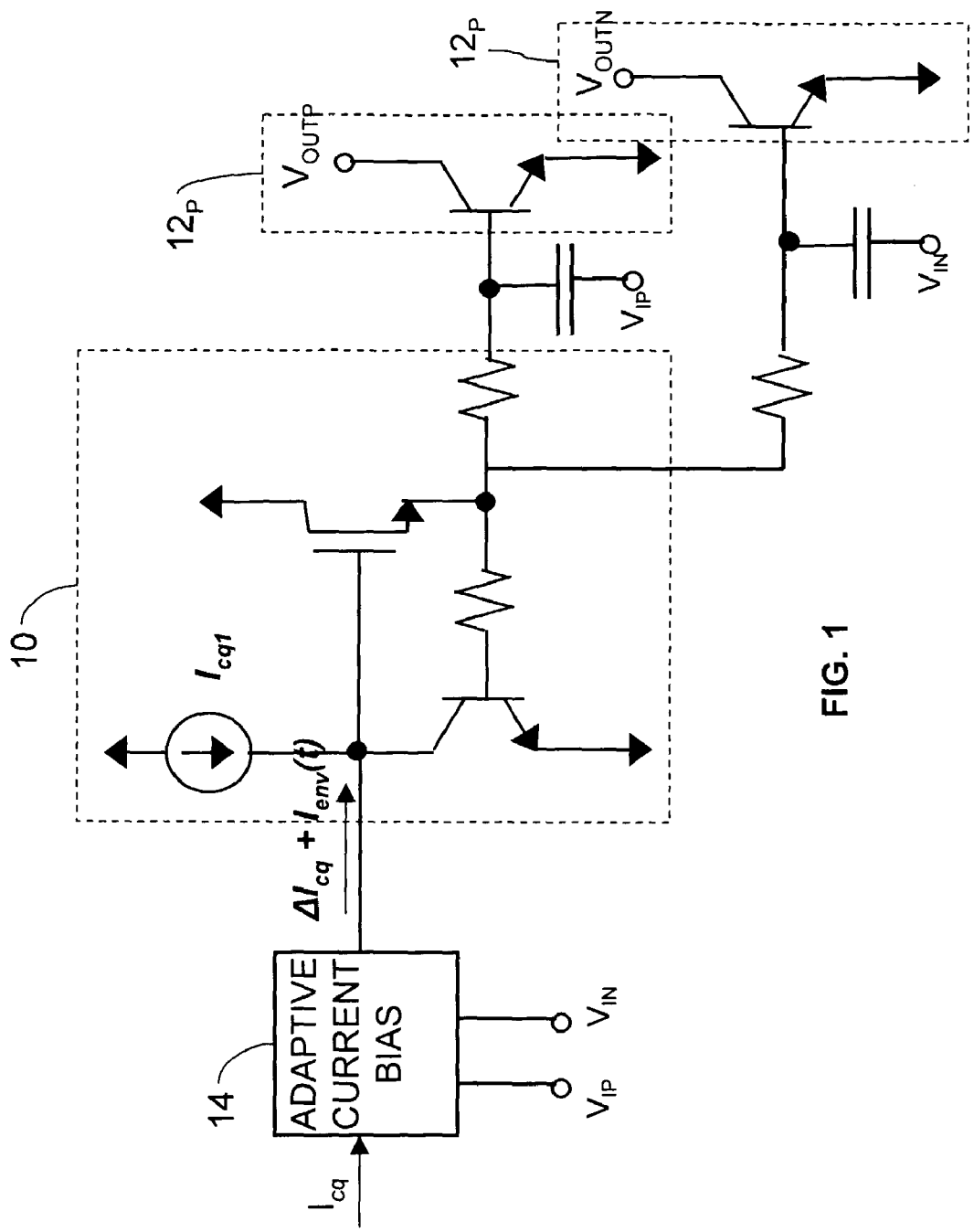
FIG. 1 is a block diagram of an adaptively biased amplifier circuit in accordance with an embodiment of the invention.

FIG. 1 illustrates an exemplary embodiment RF amplifier. In FIG. 1, a bias circuit 10 provides bias current $I_{cq1}$ to an output amplifier 12, including a positive output $12_P$ and a negative output $12_N$. An adaptive bias current circuit 14 senses the input power differential between the positive and negative voltages $V_{IP}$ and $V_{IN}$ of the RF amplifier and provides a current boost of $\Delta I_{cq}+I_{env}(t)$, where $I_{cq}$ is the quiescent current provided to the adaptive bias current circuit 14. The dc portion $\Delta I_{cq}$ of the current boost will be discussed first, while the envelope current $I_{env}(t)$ is also advantageously provided by preferred embodiment circuits and will be discussed below. The dc current boost $\Delta I_{cq}$ is proportional to the input power and is provided to the bias circuit 10 to increase the quiescent current in response to rising input power. Though not shown in FIG. 1, the current boost can be used to counter the effect of resistor degeneration if a resistor is applied to the emitter of the transistor of the output amplifier 12. FIG. 1 shows that the adaptive bias current circuit 14 receives positive and negative input voltages. These voltages can be accepted, for example, via a single input (if relative to a ground potential or other reference potential) or via a differential input including two inputs.

Figure 2:
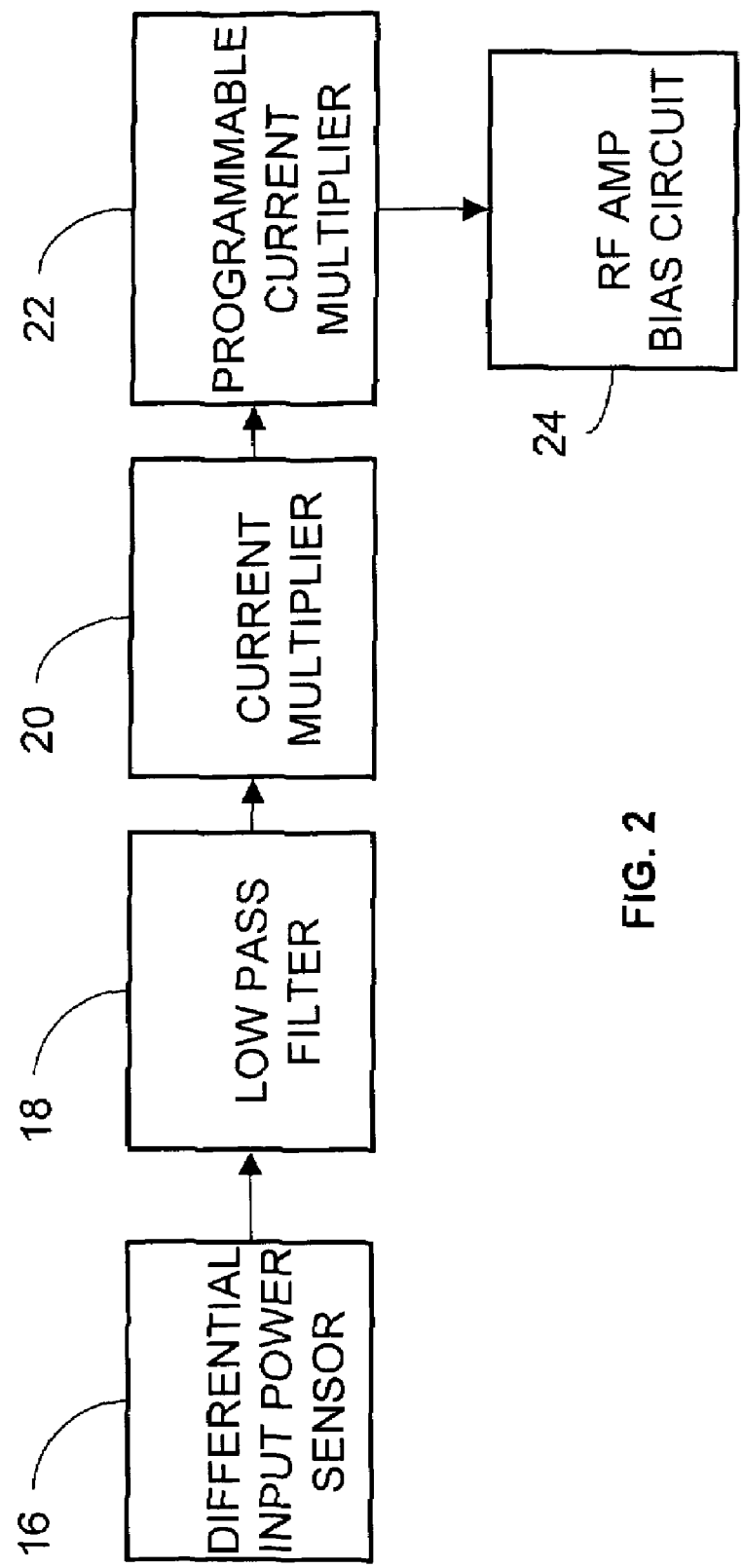
FIG. 2 is a block diagram of the adaptive bias current boost block in FIG. 1.

Referring now to FIG. 2, the general features of a preferred embodiment adaptive bias current circuit 14 are illustrated. A differential sensor 16 senses the input power difference of the positive and negative input voltages $V_{IP}$ and $V_{IN}$ of the amplifier 12. The sensor 16, preferably implemented as a differential transistor pair, produces a current proportional to the input power difference. As input power to the differential RF amplifier increases, the output current of the sensor 16 provides a high average current responsive to the level of input power during large input power conditions. A low pass filter 18 removes harmonics, and a current boost $\Delta I_{cq}+I_{env}(t)$ that is proportional to the input power is provided to a current multiplier 20, e.g., a current mirror, that increases the level of current boost by a multiplication factor. A programmable current multiplier 22 provides an additional current boost. The total multiplication factor may be termed KN, where K is a constant of the multiplier 20 and N is the multiplication factor of the multiplier 22, in which case the multiplication factor is $KN(\Delta I_{cq}+I_{env}(t))$. This current boost is provided to the bias circuit 24 of the RF amplifier. The bias circuit 24 therefore receives extra dc current, which is proportional to the input power, and envelope current. The envelope current $I_{env}(t)$ is provided in preferred embodiment adaptive bias current circuits of the invention on top of the dc current $\Delta I_{cq}$. Assuming a two-tone sinusoidal input at frequencies $\omega_1$ and $\omega_2$, the envelope signal is given by $I_{env}(t)=I_{env} \cos[(\omega_2-\omega_1)t+\Theta_{env}]$, where $I_{env}$ and $\Theta_{env}$ respectively denote the amplitude and phase of the envelope signal. The amplitude of the envelope signal can be changed by the programmable current multiplier 22 and the quiescent current value, and the low pass filter 18 determines phase of the envelope signal. The phase and the amplitude of the envelope signal may be controlled to cancel the third harmonic of the RF amplifier. See, e.g. V. Leung, J. Deng, P. Gudem and L. Larson, "Analysis of Envelope Signal Injection for Improvement of RF Amplifier Intermodulation Distortion," Proc. IEEE Custom Integrated Circuit Conf., pp. 133-136, October 2004.

Figure 3:
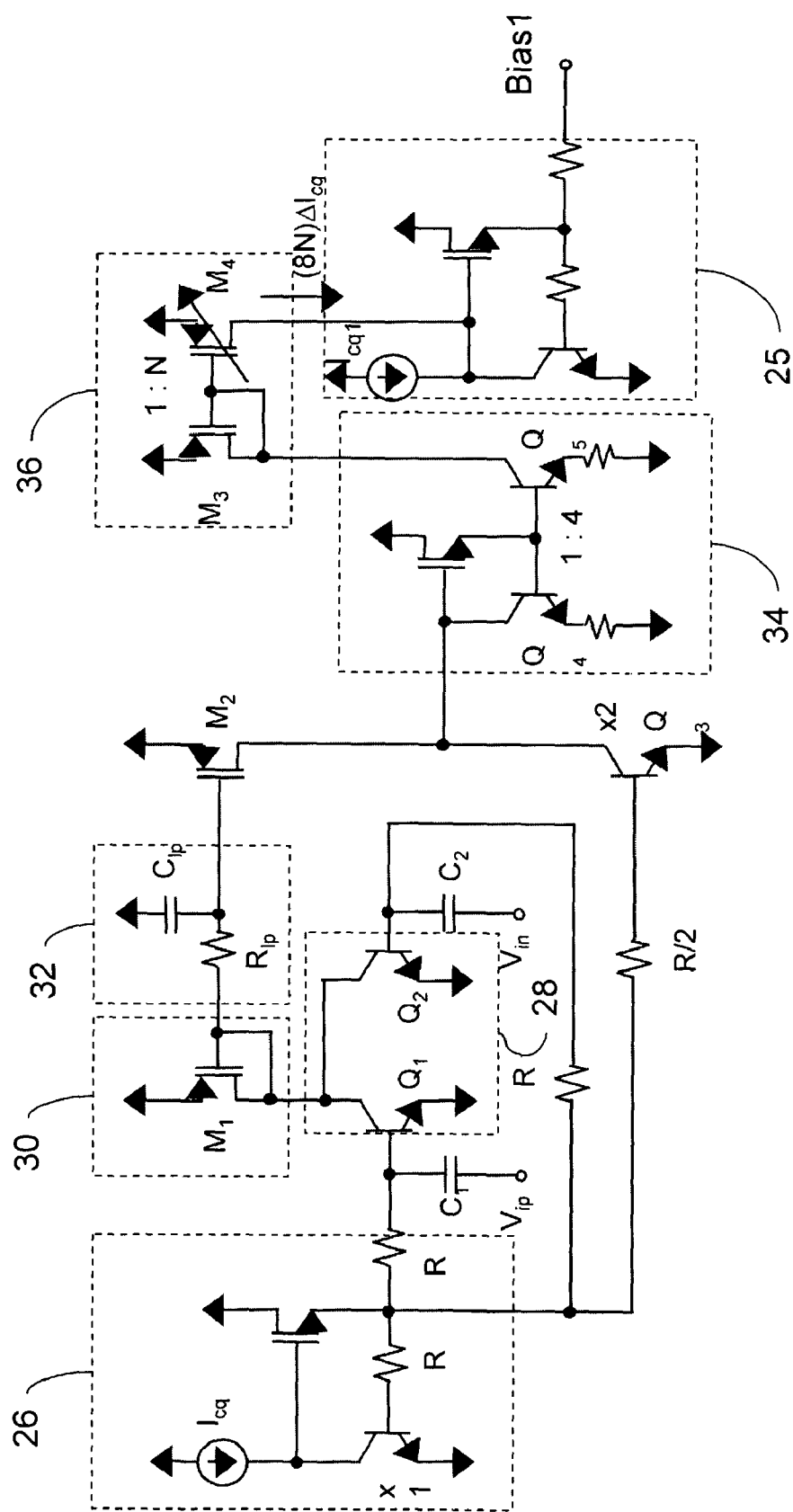
FIG. 3 is an adaptive bias current circuit in accordance with an embodiment of the invention.

FIG. 3 illustrates a preferred embodiment adaptive current bias and amplifier circuit that provides an adaptive current bias current for supplying extra current bias to a RF amplifier bias circuit 25. Low quiescent current is provided by a quiescent current bias supply circuit 26 to a differential transistor sensor 28, including differential transistors $Q_1$ and $Q_2$, that senses the differential input signals $V_{ip}$ and $V_{in}$ for the RF amplifier through two capacitors ($C_1$, $C_2$). The capacitors $C_1$ and $C_2$ should have small values (e.g. 50 fF). The values of the capacitors $C_1$ and $C_2$ should be selected to minimize loading to the RF amplifier to which the adaptive current bias circuit is connected.

Signal detection is accomplished by two bipolar transistors ($Q_1$, $Q_2$) in the differential transistor 28. The transistors $Q_1$ and $Q_2$ configured as common-emitter amplifiers. The transistors $Q_1$ and $Q_2$ are preferably biased with very low quiescent current (e.g., 20 μA). The quiescent current bias is selected to minimize power consumption while also providing a sufficient level of current boost for amplification. With a low quiescent current bias, the collector current of the transistors $Q_1$ and $Q_2$ will clip easily and drastically during large signal conditions that occur during normal operation of the RF amplifier. The predetermined level of input signal conditions that trigger clipping is a design choice that may be determined by artisans who will be able to determine transistor sizes, the quiescent current and other circuit component values that are appropriate for a particular design choice implementing the invention.

When the power level is reached where clipping occurs, the average current ($I_{ave}$), or the dc part of the clipped currents, will rise above the quiescent current level ($I_{cq}$). That is, $I_{ave}=I_{cq}+\Delta I$. The higher the signal level, the bigger the resulting average current. The collector currents $I_{Q1}$, $I_{Q2}$ are summed by a current summer 30.

Notice that the two collector currents ($I_{Q1}$, $I_{Q2}$) are differential in nature. While having the same average current, their (RF) signal components are 180° out of phase. Therefore, when the two currents are summed at the drain of a transistor $M_1$, the signal part is eliminated. The current of $M_1$ ($I_{M1}$) then contains twice the average current. In summary, $I_{M1}$ is proportional to the input signal level.

When such heavy current clipping occurs, a host of harmonic and intermodulation distortion components are generated. Signal combinations at the drain of $M_1$ would remove, to the first order, all even-order distortions. However, odd-order harmonic components will remain (with the dc component, $I_{ave}$). If $I_{M1}$ is directly fed back to an RF amplifier to supplement its quiescent current ($I_{cq1}$), the distortion components will modulate with the RF signal and degrade the amplifier linearity performances. A low pass filter 32 removes distortion components that can lead to degradation of the linearity performance of the amplifier.

Low-pass filtering is carried out on the current $I_{M1}$ by a single pole located between the gates of $M_1$ and $M_2$. The values of $R_{1p}$ and $C_{1p}$ are selected such that the pole frequency is low enough to provide sufficient rejection of the distortion components. However, if the pole frequency is set too low, the average current will not respond fast enough with the signal envelope, defeating the purpose of the adaptive bias control. In an exemplary embodiment WCDMA amplifier that we simulated where the signal bandwidth is about 5 MHz, the pole was set at 1.4 MHz (with $R_{1p}$=18 KΩ, $C_{1p}$=6.4 pF). Simulations and experiments confirmed a good compromise between good distortion removal and fast envelope tracking. These parameters and considerations can be used to select an appropriate pole frequency and values for the resistance and capacitance in the low pass filter.

After the low-pass filtering, $I_{M1}$ is mirrored to the drain of $M_2$ with a 1:1 ratio. The quiescent current ($2I_{cq}$) is subtracted at the collector of $Q_3$. The resulting current is delivered to a current mirror 34, particularly to the collector of transistor $Q_4$. The $Q_4$ collector current, $I_{Q4}$, equals $2I_{ave}-2I_{cq}=2\Delta I$. At this point, a dc current ($I_{Q4}$) has been obtained which is directly proportional to the amplifier input level $P_{in}$. The current is based upon the detected signal of the input power, and may be added directly to boost bias circuit, or more preferably, be further multiplied to provide additional current boost.

Current multiplication is provided in two stages in the example embodiment of FIG. 3. The current mirror 34 provides a constant ratio current multiplication. Specifically, the current $I_{Q4}$ is mirrored by $Q_4$ and $Q_5$. In the example embodiment, the current mirror ratio of 1:4 will magnify the current boost effects of the power detector control bias on the RF amplifier for a given input level. Transistor pair $M_3$-$M_4$ will then reverse the direction of the current flow, and deliver the dc current to supplement the quiescent current (Icq1) at the bias circuit 25 of the RF amplifier.

A second current multiplication is provided by a programmable current mirror 36. The mirror ratio between $M_3$ and $M_4$ is digitally programmable. This allows flexibility and controllability to the current boosting effects on the amplifier to account for process and temperature variations. As an example, the total transistor size of $M_4$ may be eight times bigger than that of $M_3$. Depending on a 2-bit digital control, therefore, either 8, 6, 4, and 0 units of $M_4$ can be disconnected. Thus, the mirror ratio can be digitally programmed to be either 1:0 (which effectively disables the power detector control circuit), or progressively increase to 1:2, 1:4 or 1:8. In summary, the example embodiment adaptive bias current circuit (where the mirror 34 has a 1:4 ratio and the transistor size of $M_4$ is eight times that of $M_3$) can supplement the quiescent current of the RF amplifier by 0, 16, 32 or 64 times $I_{Q4}$, where $I_{Q4}$ is proportional to $P_{in}$. Since current boost is not dependent on the amplifier base current or the output power, there is no feedback, and the adaptive bias circuit and method is inherently stable. The circuit consumes little power with a low quiescent current bias and is compact for implementation in a semiconductor fabrication.

Figure 4:
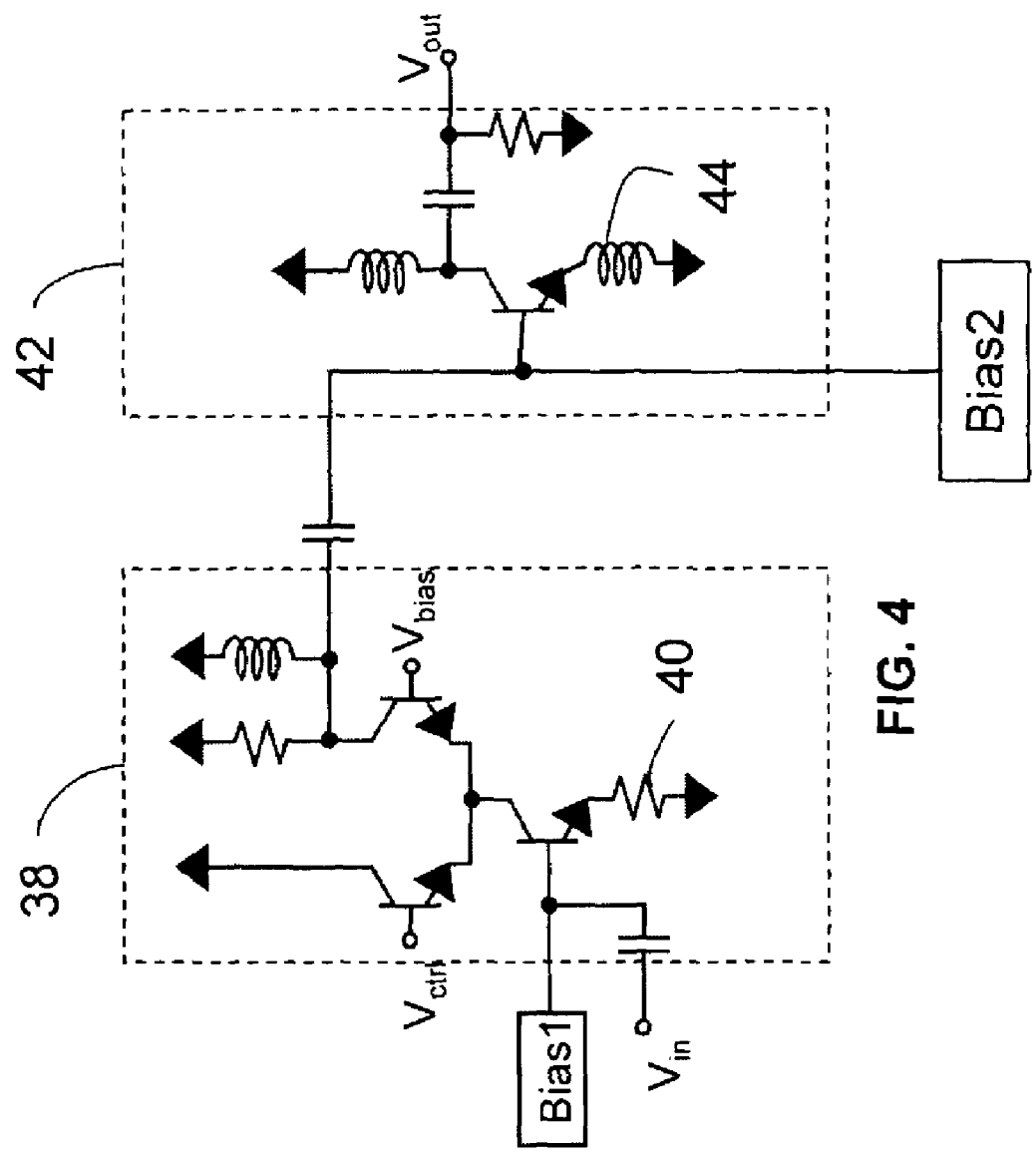
FIG. 4 illustrates one half of an exemplary multi-stage RF amplifier in accordance with an embodiment of the invention.

The adaptive bias output of the FIG. 3 circuit is labeled Bias1 in FIG. 4, and is used as the bias current supply for an example embodiment two stage amplifier shown in FIG. 4. FIG. 4 illustrates one half of an amplifier circuit for simplicity, while artisans will appreciate another identical half of the circuit would produce the opposite phase of output power. The FIG. 4 circuit is a suitable circuit, for example for a low-power driver amplifier for a WCDMA mobile phone transmitter applications.

The amplifier is a two-path two-stage single-ended design. FIG. 4 shows one path of the amplifier. The other path is unshown, but is identical and produces the opposite phase of output power. The first stage is a cascade amplifier 38 that supplies a variable gain. The amount of variable gain is determined by the level of a control voltage $V_{ctrl}$. The cascade amplifier 38 includes a degeneration resistor 40 to provide linearity. The second stage is a common-emitter amplifier 42. The common emitter amplifier provides power match and includes a degeneration inductor 44 for linearity. Bias1, provided by the example embodiment FIG. 3 circuit adaptively adjusts current consumption to achieve good linearity performance for large signal conditions, and maintains high efficiency during power back-off. Bias2 can be, for example, a normal class AB/B bias circuit. Alternatively, it could be an adaptive bias circuit of the invention where the voltage inputs would be the output voltages of the cascade amplifier 38. The bias circuit providing Bias1 and the bias circuit providing Bias2 is shared by the second path of the amplifier (separate bias circuits are not required for the second path that produces the opposite phase of output power). The FIG. 4 implementation is an example, and artisans will recognize that the method by which the FIG. 3 adaptive current bias circuit provides an adaptive bias circuit can be applied to other class AB/B amplifier circuits. Artisans will particularly appreciate the general applicability of the principals of the invention to other types of RF amplifiers.

Methods for providing adaptive bias currents and adaptive bias current circuits of the invention provide current boost to supplement the quiescent current of RF amplifiers at high power levels. Circuits of the invention may be implemented as low-power, compact, and digitally programmable implementations, and their performance is inherently stable. The adaptive bias circuits of the invention can provide Class AB/B-style bias on an amplifier with resistor degeneration.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for producing an adaptive bias current responsive to an input power of an RF amplifier, the method comprising steps of:
    accepting negative and positive input voltages of the RF amplifier;
    producing a differential current responsive to the negative and positive input voltages of the RF amplifier, wherein the differential current clips within the normal operational range of the RF amplifier; and
    filtering at least one harmonic from the differential current.

2. The method of claim 1, further comprising a step of subtracting quiescent bias current used to drive a circuit that conducts said step of producing from the differential current to produce the adaptive bias current that is responsive to the input power.

3. The method of claim 1, further comprising a step of multiplying the adaptive bias current.

4. The method of claim 3, wherein said step of multiplying comprises multiplying the adaptive bias current by a constant ratio.

5. The method of claim 4, wherein said step of multiplying further comprising a second stage multiplication that multiplies the adaptive bias current by a programmable ratio.

6. The method of claim 1, wherein said step of producing comprises:
    generating a first current responsive to a negative voltage of the input power;
    generating a second current responsive to a positive voltage of the input power; and
    summing the first current and the second current to produce the differential current.

7. The method of claim 1, wherein said step of filtering harmonics comprises low pass filtering the differential current responsive to the negative and positive input voltages of the RF amplifier.

8. The method of claim 7, wherein said step of low pass filtering is conducted with a pole frequency low enough to provide sufficient rejection of distortion components and high to respond to a signal envelope of the RF amplifier.

9. An adaptive bias current circuit for producing a bias current responsive to the input power of an RF amplifier, the bias current circuit comprising:
    current supply means for supplying a quiescent current; and
    differential power sensor means, biased by the quiescent current, for sensing the input power of the RE amplifier and for producing a bias current higher than the quiescent current when the input power reaches a high level, the bias current being responsive to the input power.

10. The circuit of claim 9, further comprising low pass filter means for filtering harmonics from the bias current.

11. The circuit of claim 10, further comprising first current multiplication means for multiplying the bias current.

12. The circuit of claim 11, further comprising second current multiplication means for multiplying the bias current by a programmable multiplication factor.

13. The circuit of claim 9, wherein said differential power means comprise:
    means for producing a first current responsive to a positive voltage phase of the input power of the RF amplifier;
    means for producing a second current responsive to a negative voltage phase of the input power of the RF amplifier; and
    means for summing the first current and the second current to produce the bias current.

14. The circuit of claim 13, further comprising low pass filter means for filtering harmonics from the bias current.

15. The circuit of claim 14, further comprising current multiplication means for multiplying the bias current.

16. An adaptive bias current circuit for producing a bias current responsive to the input power of an RF amplifier, the bias current circuit comprising:
    a quiescent current bias supply circuit generating a quiescent current;
    a differential transistor pair biased by the quiescent current, the differential transistor pair including a first transistor generating a first collector current responsive to a positive voltage phase of the input power of the RF amplifier and a second transistor generating a second collector current responsive to a negative voltage phase of the input power of the RF amplifier, the quiescent current set to permit the first and second collector currents to clip when the input power of the RF amplifier reaches a predetermined level; and
    a current summer for summing the first and second collector currents to produce the bias current.

17. The circuit of claim 16, further comprising a low pass filter that receives and filters the bias current.

18. The circuit of claim 17, further comprising:
    a first current mirror to mirror the bias current:
    a subtractor to remove an amount of current corresponding to the quiescent current from the bias current; and
    a second current mirror to mirror and multiply the bias current.

19. The circuit of claim 18, further comprising a third current mirror that is programmable for multiplying the bias current.

20. An RF amplifier, the amplifier comprising:
    a current bias circuit in accordance with claim 16; and
    an amplifier circuit receiving the bias current from the current bias circuit.

21. The RF amplifier of claim 20, further comprising an output transistor amplifier in said amplifier circuit, said output transistor amplifier including a degeneration resistor.

22. An adaptive bias current circuit comprising:
    a current supply configured to supply a quiescent current; and
    a differential power sensor configured to be biased by at least the quiescent current and to determine an input power of the RF amplifier and to generate a bias current larger than the quiescent current when the input power reaches a predetermined high level, the bias current being roughly proportional to the input power.

* * * * *